United States Patent
Ogihara et al.

[11] Patent Number: 6,054,724
[45] Date of Patent: Apr. 25, 2000

[54] LIGHT-EMITTING DIODE, LIGHT-EMITTING DIODE ARRAY

[75] Inventors: Mitsuhiko Ogihara; Yukio Nakamura; Masumi Taninaka; Hiroshi Hamano, all of Tokyo, Japan

[73] Assignee: Oki Electric Industry Co., Ltd., Tokyo, Japan

[21] Appl. No.: 08/923,816

[22] Filed: Sep. 4, 1997

[30] Foreign Application Priority Data

Oct. 9, 1996 [JP] Japan ................................. 8-268934

[51] Int. Cl.⁷ .................................................. H01L 33/00
[52] U.S. Cl. ................................ 257/88; 257/90; 257/94; 257/96; 257/97; 257/103
[58] Field of Search ................................. 257/94, 96, 97, 257/103, 88, 90

[56] References Cited

U.S. PATENT DOCUMENTS

| | | | |
|---|---|---|---|
| 3,963,538 | 6/1976 | Broadie et al. | 148/175 |
| 3,963,539 | 6/1976 | Kemlage et al. | 148/175 |
| 4,644,342 | 2/1987 | Abbas | 340/762 |
| 4,897,699 | 1/1990 | Razeghi et al. | 357/4 |
| 4,928,154 | 5/1990 | Umeno et al. | 357/16 |
| 4,963,508 | 10/1990 | Umeno et al. | 437/132 |
| 5,107,317 | 4/1992 | Takasaki | 357/30 |

FOREIGN PATENT DOCUMENTS

| | | |
|---|---|---|
| 0 329 400 | 8/1989 | European Pat. Off. . |
| 0 723 285 | 7/1996 | European Pat. Off. . |
| 1212483 | 8/1989 | Japan . |
| 8-203841 | 8/1996 | Japan . |

OTHER PUBLICATIONS

Yoshihiro Takekida, "Design of Optical Printers", 1985 pp. 121–126.

*Primary Examiner*—William Mintel
*Attorney, Agent, or Firm*—Venable; Robert J. Frank; Catherine M. Voorhees

[57] ABSTRACT

A compound semiconductor layer of a first conductivity type is formed on a substrate, and a diffusion region of a second conductivity type is formed on the compound semiconductor layer. The light-emitting diode has a high emitted light power, using a large-diameter wafer.

8 Claims, 6 Drawing Sheets

LIGHT-EMITTING DIODE, LIGHT-EMITTING DIODE ARRAY

BACKGROUND OF THE INVENTION

The present invention relates to a light-emitting diode, a light-emitting diode array, and a method of their fabrication.

A conventional light-emitting diode is disclosed in the publication, "Design of an Optical Printer", Triceps WS 6, 1985, pp. 121–126. The structure of the conventional LED and the method of its fabrication will first be described with reference to FIG. 7.

Figure 7:
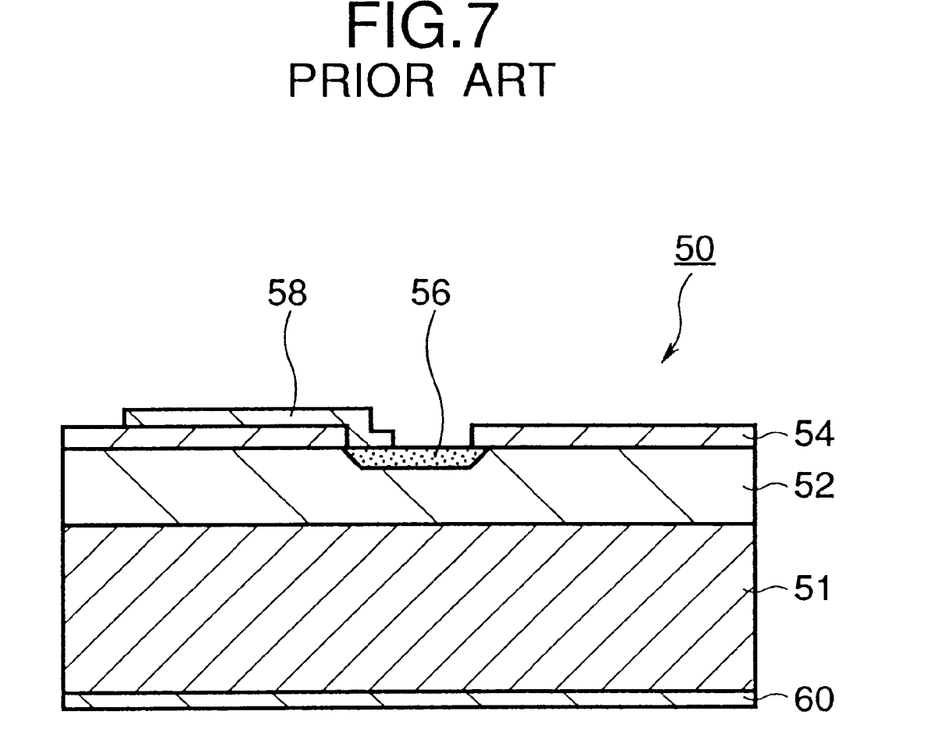
FIG. 7 is a cross sectional view showing the structure of the LED in the prior art.

The illustrated conventional LED 50 is formed of an n-type GaAs substrate 51, and an n-type GaAsP layer 52 formed on the GaAs substrate, and a diffusion mask 54 having an aperture formed on the GaAsP layer 52. The LED 50 is provided with a p-type diffusion region 56 on the surface of the n-type GaAsP layer 52.

A p-side electrode 58 is provided to extend on the surface of the diffusion mask 54 and the p-type diffusion region 56. An n-side electrode 60 is provided on the lower surface having the substrate 51.

A vapor-phase diffusion is generally used to form the diffusion layer 56 in the n-type GaAsP layer 52.

With the conventional LED 50, the GaAs substrate 51 is used as the substrate 51, and a relatively thick n-type GaAsP layer 52 is formed on the substrate 51. For this reason, the diffusion region 56 can be formed by vapor-phase diffusion, deeply in the n-type GaAsP layer 52.

The conventional LED has the following problems with regard to the substrate.

Because a GaAs substrate is used as the substrate 51, it is easily broken during dicing, and is easily chipped off during dicing, so dicing has to be conducted slowly.

Moreover, the dimension of the wafer is utmost 3 inches (about 7.62 cm) at present, and a wafer of a diameter larger than 3 inches (e.g., of 8 inches (about 20.32 cm)) is not available. In addition, the cost of the substrate is higher than a silicon substrate or the like.

To solve the problems described above, an attempt has been made to form a compound semiconductor layer on a silicon (Si) substrate. However, this brings about the following problems.

If a compound semiconductor layer is formed to a large thickness on a silicon substrate, a crack may be produced in the compound semiconductor layer because of the difference in the thermal expansion coefficient between the materials of the substrate and the compound semiconductor layer, and no useful device is obtained. The present inventors have confirmed that cracks are generally produced in the compound semiconductor layer if the thickness of the compound semiconductor layer 3.5 µm or more. For this reason, there has been a restriction that the compound semiconductor layer on the Si substrate cannot be made thick.

If the compound semiconductor layer on the substrate is made thin, and if a diffusion layer is formed by vapor-phase diffusion, the depth of the diffusion region may exceed the thickness of the compound semiconductor layer, and no pn junction can be formed. For these reasons, it was very difficult to form an LED or LED array using the Si substrate of a large diameter.

SUMMARY OF THE INVENTION

In view of the above, an object of the invention is to provide an LED and an LED array which are associated with no cracking and chipping-off even if a compound semiconductor layer is formed on a large-diameter wafer, and which has a superior light emitting intensity characteristics.

Another object of the invention is to provide a method of fabrication of such an LED or an LED array.

According to a first aspect of the invention, there is provided a light-emitting diode having a compound semiconductor layer of a first conductivity type on a substrate at least a surface portion of which is formed of silicon, and an impurity diffusion region of a second conductivity type provided in the compound semiconductor layer as a light emitting layer, wherein the diffusion layer is a solid-phase diffusion layer.

With the above arrangement, the diffusion region of the second conductivity type formed by the solid-phase diffusion in the compound semiconductor layer is provided, so that the depth of the diffusion region can be reduced. Moreover, the impurity concentration in the diffusion region can be made higher, compared with the conventional vapor-phase diffusion. Accordingly, even if the depth of the diffusion layer of an LED is reduced, the emitted light power suitable for printing in a printer can be obtained.

It is preferable that the diffusion region is formed from the surface of the compound semiconductor layer to a depth of 20 to 60% of the depth of the compound semiconductor layer.

If the depth of the diffusion region is from the surface of the compound semiconductor layer to the depth of 20 to 60% of the thickness of the layer, the emitted light power can be maintained at a level suitable for printing in a printer. That is, even if the depth is restricted to such a value, it is possible to restrain an increase of the sheet resistance, and to restrain the reduction of the emitted light power, and it is possible to prevent the depth from approaching the thickness of the compound semiconductor layer, thereby avoiding a situation in which motion of the carriers at the pn junction or re-combination of the carrier due to light emission are disabled, and in which light emission of the LED is stopped.

It is preferable that the lower limit of the diffusion impurity concentration in the diffusion region is $5 \times 10^{19}$ atoms/cm$^3$.

If the diffusion impurity concentration in the diffusion region is $5 \times 10^{19}$ atoms/cm$^3$, it is possible to achieve a high emitted light power even if the diffusion region is shallow.

It is preferable that an additional compound semiconductor layer is provided as a buffer layer between the substrate and the first-mentioned compound semiconductor layer in which the diffusion region is formed.

The buffer layer alleviates the stress generated by the difference in the thermal expansion coefficient and lattice-constant mismatch between the silicon substrate and the first-mentioned compound semiconductor layer, and generation of cracks in the first-mentioned compound semiconductor layer and the defect concentration can be reduced.

The invention also provides a light-emitting diode array having a compound semiconductor layer of a first conductivity type on a substrate at least a surface portion of which is formed of silicon, and impurity diffusion regions of a second conductivity type provided in the compound semiconductor layer as a light emitting layer, said diffusion regions being aligned to form an array, wherein said diffusion layers are solid-phase diffusion layers.

According to another aspect of the invention, there is provided a method of fabricating a light-emitting diode comprising the steps of:

forming a compound semiconductor layer of a first conductivity type on a substrate at least a surface portion of which is formed of silicon; and forming a diffusion region of a second conductivity type in the compound semiconductor layer as a light emitting layer; and wherein the diffusion region is formed by solid-phase diffusion.

With the above arrangement, the diffusion region of the second conductivity type is formed in the first compound semiconductor layer, by a solid-phase diffusion method, so that the depth of the diffusion region from the surface of the compound semiconductor layer is small, and it is possible to form an impurity diffusion region of a higher concentration, compared with the conventional vapor-phase diffusion. Accordingly, an emitted light power of an LED suitable for printing in a printer can be obtained.

It is preferable that the method further comprises, prior to the step of forming the diffusion region, (a) the step of forming a diffusion mask having an aperture on the first compound semiconductor layer; and (b) the step of thereafter annealing for removing crystal defects in that part of said compound semiconductor layer which is exposed by said aperture of said diffusion mask.

Thus, in a step prior to the formation of the diffusion region, annealing is applied to the structure including the diffusion mask, so that the crystal defects in the part of the compound semiconductor layer exposed by the aperture of the diffusion mask can be eliminated, or reduced to such a level which does not affect the fabrication of an LED or the operation of an LED.

It is preferable that an aluminum nitride film is used as the diffusion mask.

The use of an aluminum nitride film as the diffusion mask is advantageous in that aluminum nitride has a good adhesive property with the compound semiconductor layer, and there is such a difference in the thermal expansion coefficient that gives a suitable stress to the substrate, and even if the temperature of the annealing process is made high, generation of cracks in the diffusion mask can be prevented.

The diffusion mask may alternatively be formed of an SiN film.

The difference in the thermal expansion coefficient between the SiN film and the compound semiconductor is greater than that between the AlN film and the compound semiconductor. However, it has been confirmed that if the SiN film is not more than 5000 Å, no cracks occur in the SiN diffusion mask. The adhesion of the SiN film to the semiconductor is also satisfactory.

The difference in stress between the part covered by the diffusion mask film and the part uncovered by the diffusion mask film (exposed by the aperture in the diffusion mask film) is greater with a greater difference in thermal expansion coefficient between the diffusion mask film and the substrate.

Accordingly, the difference in the stress is greater if the SiN film is used, than if the AlN film is used. The greater difference in the stress results in a greater effect of removing defects from the aperture part (part exposed by the aperture). In other words, the use of the SiN film results in a greater effect in removing the defects.

The invention also provides a method of fabricating a light-emitting diode array comprising: the steps of forming a compound semiconductor layer of a first conductivity type on a substrate at least a surface portion of which is formed of silicon; and forming diffusion regions of a second conductivity type in the compound semiconductor layer as a light emitting layer, the diffusion regions being aligned to form an array; and wherein the diffusion regions are formed by solid-phase diffusion.

DETAILED DESCRIPTION OF THE PREFERRED EMBODIMENTS

A light-emitting diode (LED) and an LED array, and a method of their fabrication according to the invention will now be described. FIG. 1A, FIG. 1B, FIG. 2A, FIG. 2B, FIG. 3, FIG. 4, and FIG. 6A to FIG. 6C show only schematically the shape, the size and disposition of respective constituting parts to such a degree as to facilitate an understanding of the invention.

First Embodiment

Figure 1A:
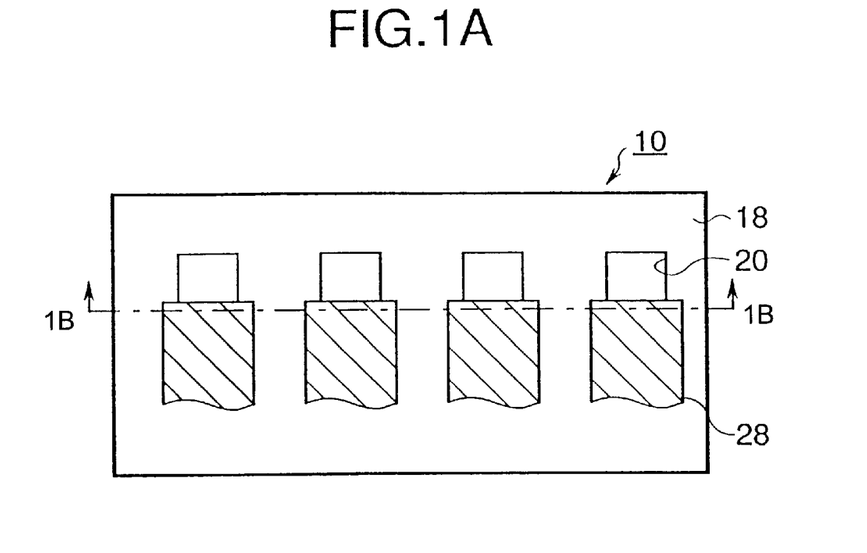
FIG. 1A is a plan view showing part of an LED array of the first embodiment of the invention.
Figure 1B:
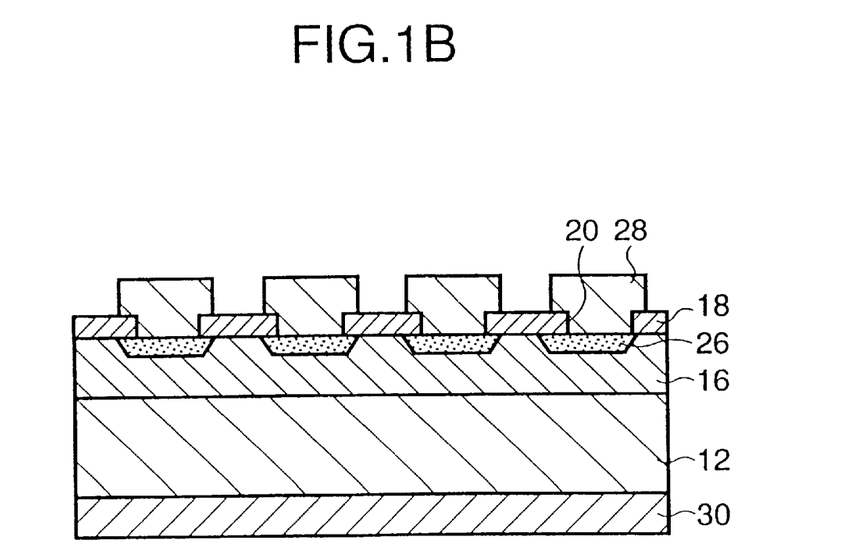
FIG. 1B is a sectional view taken along line 1B—1B in FIG. 1A.

A first embodiment of a light-emitting diode (hereinafter referred to as "LED") array will be described with reference to FIG. 1A and FIG. 1B. FIG. 1A and FIG. 1B show an LED array having a plurality of LED's. FIG. 1A is a plan view of the LED array, while FIG. 1B is a sectional view along line 1B—1B in FIG. 1A. The hatching in FIG. 1A is for ease of observation and does not indicate a section.

An LED array 10 of the first embodiment comprises a substrate 12 formed of an n-type silicon (Si). A compound semiconductor layer 16 of a first conductivity type is formed on the silicon substrate 12, and a diffusion mask 18 having apertures 20 is formed on the compound semiconductor layer 16. The compound semiconductor layer 16 is formed of an n-type $Al_xGa_{1-x}As$ layer, where x represents the composition ratio, satisfying $0<x<1$.

Diffusion regions 26 of a second conductivity type, i.e., p-type, are formed to emit light, in parts of the n-type $Al_xGa_{1-x}As$ layer 16 exposed by the aperture 20. For instance, zinc (Zn) is used as the p-type impurity. The $Al_xGa_{1-x}As$ layer 16 is about 2.5 $\mu$m thick and the depth of the p-type diffusion regions (also called the depth of the pn junction) is about 1 $\mu$m. It has been experimentally confirmed that production of cracks can be prevented if the thickness of the n-type $Al_xGa_{1-x}As$ layer 16 is about 3.5 μm or less, when the n-type $Al_xGa_{1-x}As$ layer 16 is formed on n-type Si substrate 12. For this reason, the thickness of the n-type $Al_xGa_{1-x}As$ layer 16 in this embodiment is set to be about 2.5 μm.

The p-type diffusion regions 26 are a solid-phase impurity diffusion regions, and the diffusion impurity concentration is at least $5\times10^{19}$ atoms/cm$^3$. By effecting the diffusion such that the diffusion impurity concentration of the impurity for example of Zn in the diffusion regions is at least $5\times10^{19}$ atoms/cm$^3$, the sheet resistance of the p-type diffusion regions 26 can be lowered substantially sufficiently, so that extreme reduction in the light extracting efficiency (light emitting efficiency) is prevented.

Also, according to the invention, the diffusion regions 26 are formed from the surface of the n-type $Al_xGa_{1-x}As$ layer 16 to the depth of 20 to 60% of the depth of the n-type $Al_xGa_{1-x}As$ layer 16. The reason for setting such a range is that if the depth of the pn Junction is within the range of from the surface is 0.5 to 1.5 μ, the emitted light power of the LED is not substantially reduced, and the emitted light power of the LED array suitable for a printer can be obtained.

In this embodiment, the depth of the pn Junction is set at 1 μm, while the thickness of the n-type $Al_xGa_{1-x}As$ layer 16 is 2.5 μ.

The LED array 10 according to the invention is provided with p-side electrodes (also called individual electrodes) 28, provided on an upper surface of the substrate 12, in contact with the p-type diffusion regions 26 and extending over the surface of the diffusion mask 18, and an n-side electrode (also called a common electrode) 30 provided on the lower surface of the substrate 12.

Second Embodiment

Figure 2A:
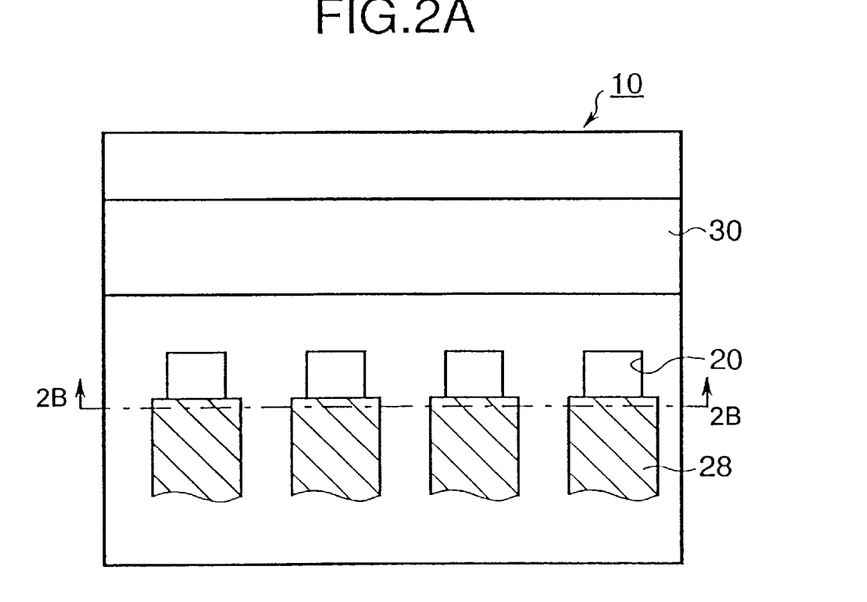
FIG. 2A is a plan view showing part of an LED array of a second embodiment.
Figure 2B:
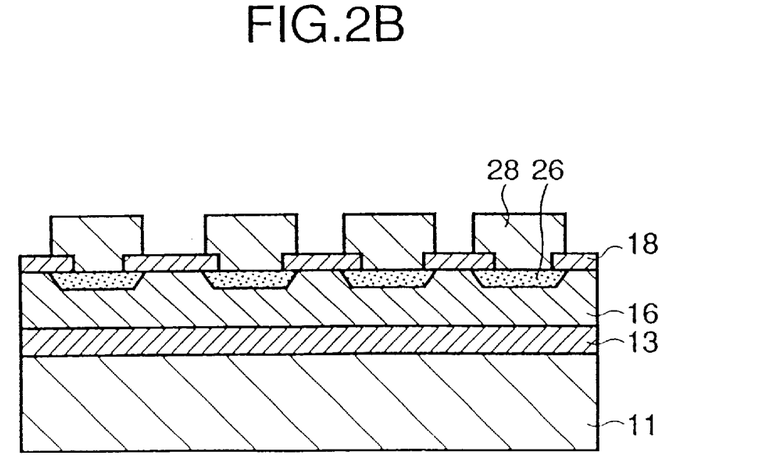
FIG. 2B is a sectional view taken along line 2B—2B in FIG. 2A.

A second embodiment of an LED array will next be described with reference to FIG. 2A and FIG. 2B. FIG. 2A is a plan view of this embodiment. FIG. 2B is a cross sectional view, taken along a section along line 2B—2B in FIG. 2A.

In the second embodiment, the substrate for the LED array comprises an insulating layer 11, and a silicon layer 13 formed on the insulating layer 11. The rest of the construction is the same as that of the first embodiment.

Here, the insulating layer 11 is, for example, a sapphire layer. The combination of the insulating layer 11 and the silicon layer 13 formed on the insulating layer 11 is also called an SOI (silicon on insulator). When an SOI substrate is used, the n-side electrode 30 needs to be provided in the same plane as the p-side electrodes 28. The n-side electrode 30 is connected to the n-type $Al_xGa_{1-x}As$ layer 16 (not shown as such).

The silicon layer 13 formed on the insulating layer 11 may be an n-type Si layer, a p-type silicon layer, or a high-resistance silicon layer.

The substrate formed of the first or second embodiment is not easily broken during dicing, and the handling of the wafer in the fabrication process is facilitated. Moreover, since the substrate is flat and is not easily broken, the process can be automated. Moreover, since the speed of dicing can be increased, the throughput can be substantially improved. Production of cracks during dicing step is reduced, and accurate cutting is enabled. Furthermore, if the SOI or Si is used as the substrate, a larger diameter of the substrate, which was not possible in the past can be realized, and the chip length can therefore be increased. Furthermore, by using a large-diameter substrate, the cost of the LED array chip can be reduced compared with the prior art.

Third Embodiment

Figure 3:
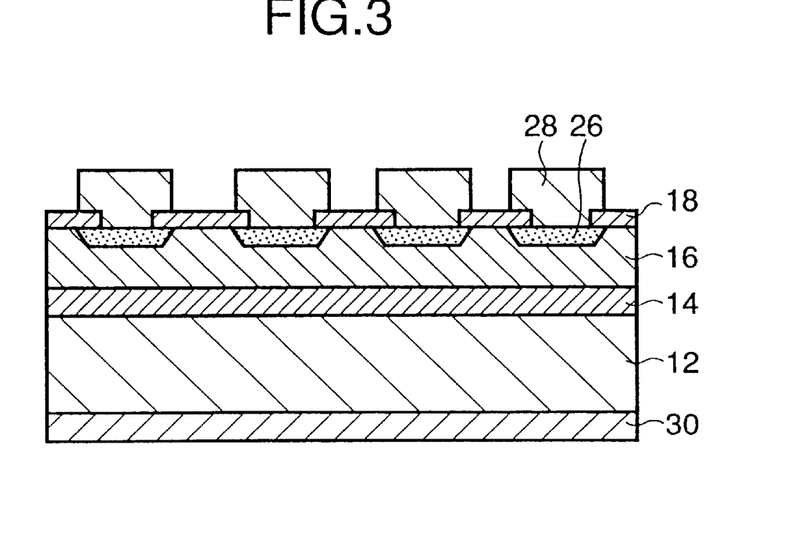
FIG. 3 is a sectional view showing an LED array of a third embodiment.

A third embodiment of the LED will next be described with reference to FIG. 3. A plan view of the third embodiment is the same as FIG. 1A. FIG. 3 is a sectional view taken along a line similar to line 1B—1B.

The third embodiment is identical to the first embodiment, but a buffer layer 14 is interposed between the substrate 12 and the n-type $Al_xGa_{1-x}As$ layer 16.

The buffer layer 14 is formed, for example, of an n-type GaAs layer, and serves to alleviate the effect of the stress generated because of the difference in the thermal expansion coefficient and lattice-constant mismatch between the Si substrate 12 and the n-type $Al_xGa_{1-x}As$ layer 16. Accordingly, generation of cracks and the defect concentration in the n-type $Al_xGa_{1-x}As$ layer 16 can be reduced.

Fourth Embodiment

Figure 4:
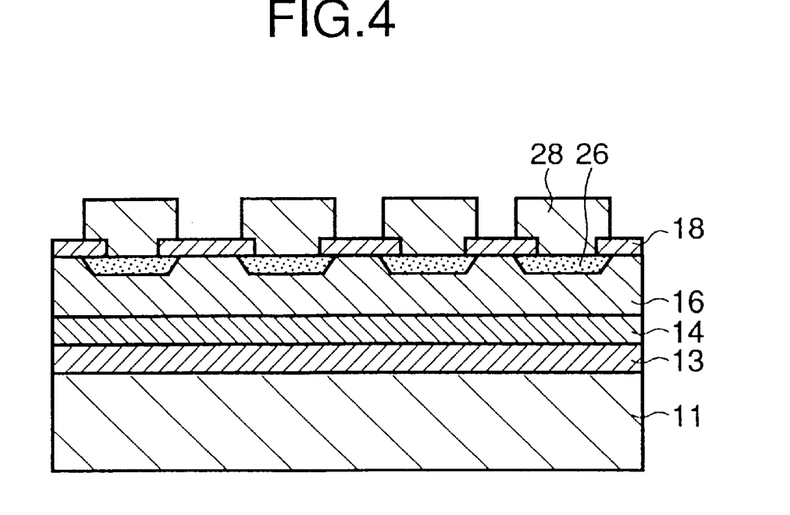
FIG. 4 is a sectional view showing an LED array of a fourth embodiment.

A fourth embodiment of the LED will next be described with reference to FIG. 4. A plan view of the fourth embodiment is the same as FIG. 2A. FIG. 4 is a sectional view taken along a line similar to 2B—2B.

The fourth embodiment is identical to the second embodiment, but a buffer layer 14 is interposed between the silicon layer 13 and the n-type $Al_xGa_{1-x}As$ layer 16.

The buffer layer 14 is formed, for example, of an n-type GaAs layer, and serves to alleviate the effect of the stress generated because of the difference in the thermal expansion coefficient and lattice-constant mismatch between the SOI (combination of the silicon layer 13 and the insulating layer 11) and the n-type $Al_xGa_{1-x}As$ layer 16. Accordingly, generation of cracks and the defect concentration in the n-type $Al_xGa_{1-x}As$ layer 16 can be reduced.

Figure 5:
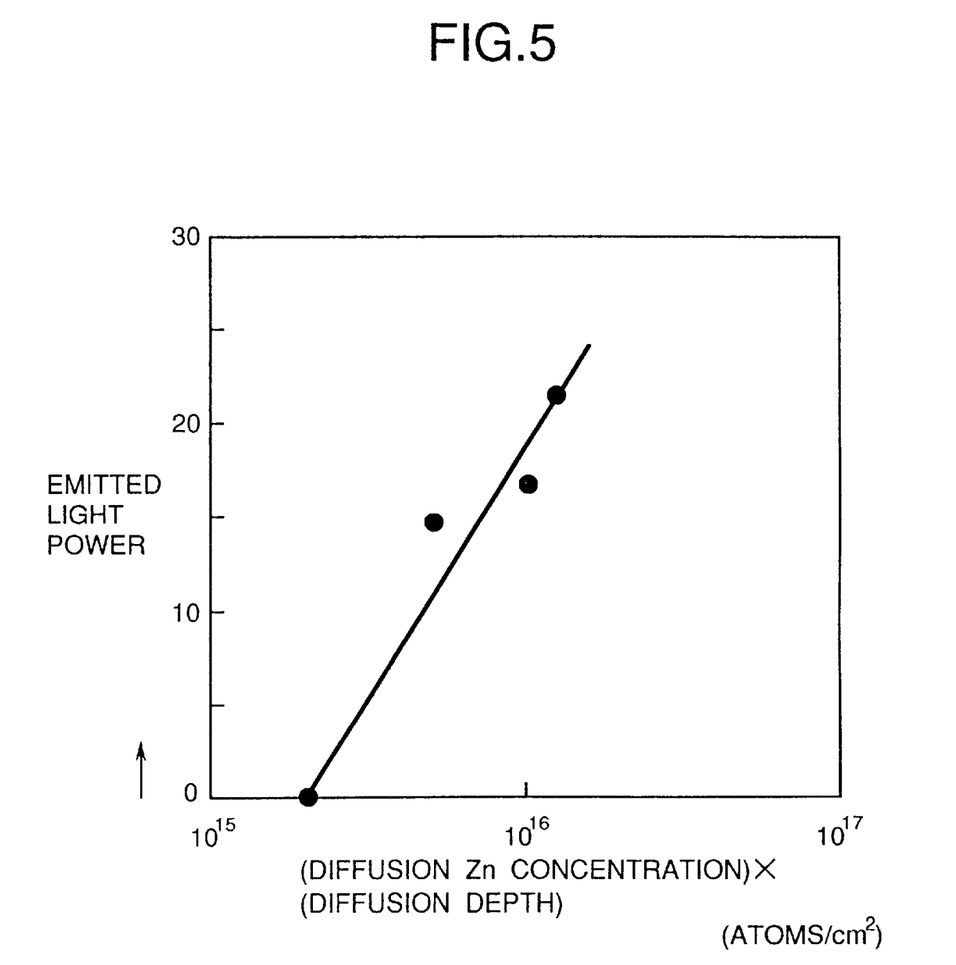
FIG. 5 is a graph illustrating the relationship between the (diffusion impurity concentration)×(depth of diffusion) and the emitted light power.

The relationship between the diffusion impurity concentration in the impurity diffusion region in the LED array and the emitted light power will next be described with reference to FIG. 5. In FIG. 5, (the diffusion Zn concentration)×(the diffusion depth (atoms/cm$^3$)) is taken on the abscissa, with a logarithmic scale, and the emitted light power (μW) is taken on the ordinate. The diffusion Zn concentration is expressed in atoms/cm$^3$, and the diffusion depth is expressed in cm. The specimens used for the measurement are the LED arrays of the third embodiment. The diffusion Zn concentration in the diffusion region is measured by secondary ion mass spectroscopy. For the measurement of the emitted light power, a voltage is applied between the p-side electrode 28 and the n-side electrode 30 of the specimen, and a current of about 5 mA is made to flow through the LED element, and the emitted light power is measured by a photo sensor at a position 30 mm from the specimen.

As will be seen from FIG. 5, the emitted light power is zero when the diffusion zinc concentration per area of the diffusion region is about $2\times10^{15}$ atoms/cm$^2$. When the diffusion Zn concentration is about $5\times10^{15}$ atoms/cm$^2$, the emitted light power will be about 15 μW. When the diffusion Zn concentration is about $1\times10^{16}$ atoms/cm$^2$, the emitted light power will be 17 to 23 μW. If the emitted light power is 15 μW or more, it is sufficient as a printer light source.

In the embodiment of the invention, the depth of the diffusion region is about 1 μm from the surface of the n-type $Al_xGa_{1-x}As$ layer 16, so that if the diffusion impurity concentration per area of the diffusion region is converted to the diffusion Zn concentration per volume, it will be about $5\times10^{19}$ atoms/cm$^3$. To obtain an emitted light power suitable for printing in a printer, the Zn concentration in the diffusion region in the LED array should be about $5\times10^{19}$ atoms/cm$^3$ or more.

The LED array having a Zn diffusion region is not inferior to the conventional array using a GaAsP/GaAs substrate, and a substantially equal emitted light power can be obtained.

Method of Fabricating the LED array

A method of fabricating an LED array according to the invention will next be described, taking the third embodiment as an example, with reference to FIG. 6A to FIG. 6C, which show the process steps of fabrication of the LED array.

For fabricating the LED array of the third embodiment, an n-type Si substrate 12 is used. An n-type GaAs layer 14 is formed on the substrate 12 using, for example, metal organic chemical vapor deposition (MOCVD method).

Then, an n-type $Al_xGa_{1-x}As$ layer 16 is formed on the n-type GaAs layer 14, using, for example, the MOCVD method.

Figure 6A:
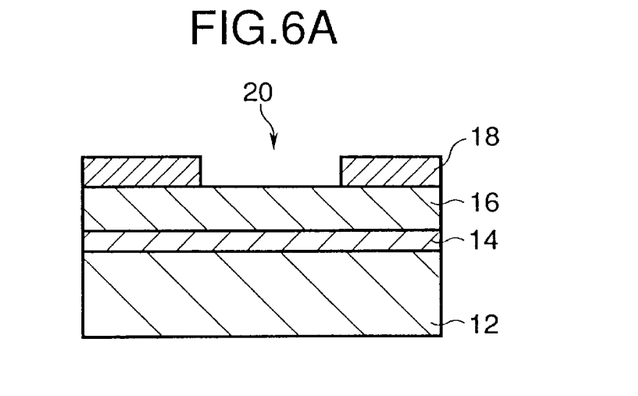
FIG. 6A to FIG. 6C are diagrams showing the steps in the fabrication of the LED array according to the invention.
Figure 6B:
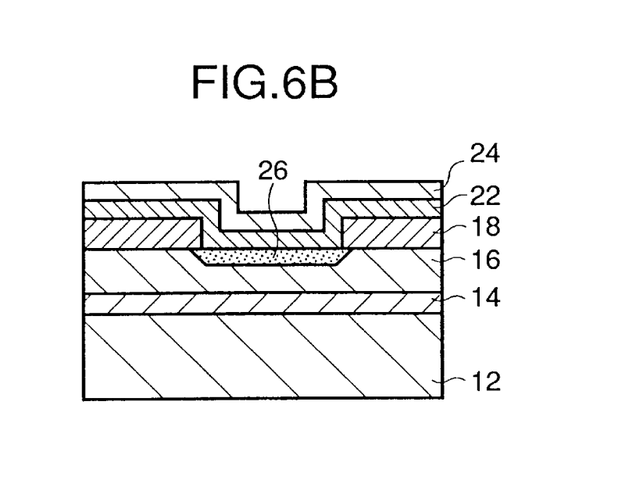

A diffusion mask 18 having apertures 20 is formed on the n-type $Al_xGa_{1-x}As$ layer 16, using photolithography (FIG. 6A). In the example under consideration, the diffusion mask 18 is aluminum nitride (AlN) or silicon nitride (SiN).

The wafer having the diffusion mask formed thereon (shown in FIG. 6A) is then introduced into a furnace, and a high-temperature anneal is applied to the wafer, to remove or reduce crystal defects in the parts of the n-type $Al_xGa_{1-x}As$ layer 16 which are exposed to the atmospheric gas by the apertures 20 of the mask 18. The conditions for the annealing are set forth below.

The atmosphere: alsine ($AsH_3$) gas

The temperature of the structure (in particular, the layer 16): 800° C. to 900° C.

The alsine gas is used in order to prevent out-diffusion of As from the n-type $Al_xGa_{1-x}As$ layer 16 during the high-temperature annealing.

A diffusion source film 22 containing Zn (zinc) impurity and a cap film 24 are formed sequentially on the surface of the structure of FIG. 6A. In the example under consideration, the diffusion source film 22 is $ZnOSiO_2$ film, and the cap film 24 is an AlN film. For forming the diffusion source film 22, the following apparatus is used, and the conditions for forming the film are as follows.

Film forming apparatus: sputtering apparatus

Target: a sintered material of $ZnOSiO_2$

Temperature of the substrate: room temperature (about 25° C.)

Atmospheric gas in the chamber: argon gas

Pressure within the chamber: 3 Pa

RF power: 500 W

The structure on which the diffusion source film 22 and the cap film 24 have been formed is next introduced into a diffusion furnace (not shown), and p-type diffusion regions 26 are formed in the n-type $Al_xGa_{1-x}As$ layer 16, by a solid-phase diffusion method. The conditions for the solid-phase diffusion are as follows:

Atmosphere in the furnace: nitrogen gas (atmospheric pressure)

Temperature of the structure (in particular, the layer 16): about 700° C.

Instead of nitrogen gas, some other inert gas may be used. Here, the temperature of the structure is 700° C. (optimum temperature). But a suitable temperature ranges from 600 to 800° C. By the solid-phase diffusion, the concentration of Zn in the Zn diffusion regions 26 can be made to be $10^{20}$ atoms/cm$^3$.

By performing the diffusion processing at such a temperature, Zn contained in the diffusion source film 22 is diffused into the n-type $Al_xGa_{1-x}As$ layer 16. The depth of the diffusion regions 26 should be smaller than the thickness of the n-type $Al_xGa_{1-x}As$ layer 16 (FIG. 6B). In this embodiment, the time of diffusion is adjusted such that the depth of the diffusion region is about 1 µm.

Next, an arbitrary and suitable method is used to remove the diffusion source film 22 and the cap film 24. P-side electrodes 28 are then formed by depositing aluminum (Al) on the wafer by electron-beam evaporation, and subsequent photolithography and wet etching.

Sintering is applied to the p-side electrodes 28 to form an ohmic contact (not shown) with a low contact resistance, under the electrode 28.

Figure 6C:
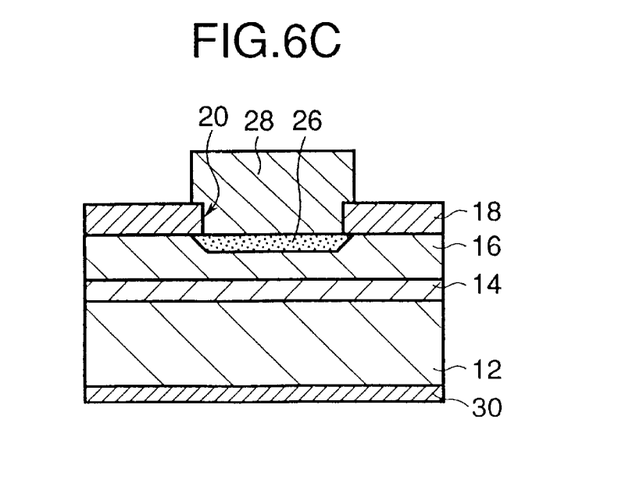

Aluminum, for example, is deposited on the lower surface of the Si substrate 12 by electron beam evaporation, to form an n-side electrode 30 (FIG. 6C). An LED array is completed through the above-described process steps.

As will be understood from the above description, the LED array according to the invention provides an emitted light power (about 20 µW in the example described with reference to FIG. 5) so that it can be used for printing in a printer even if the depth of the diffusion region, i.e., the pn junction depth is made shallow.

Instead of the n-type $Al_xGa_{1-x}As$ layer, a GaAs layer may be used where light emission is in the infrared region, a ternary (three-element) mixed crystal such as GaInAs layer, or a four-element mixed crystal such as GaInAsP layer may be used where light emission is in the visible light region.

As will be apparent from the above description, according to the LED array of the invention, a compound semiconductor layer of a first conductivity type is provided on the substrate, and diffusion regions of a second conductivity type are formed by solid-phase diffusion method. Even if the diffusion regions are shallow, the diffusion impurity concentration can be made higher, compared with the prior art. Accordingly, even if the diffusion regions are made shallow, the diffusion impurity concentration can be made high, and an emitted light power suitable for printing in a printer can be obtained.

What is claimed is:

1. A light-emitting diode having a compound semiconductor layer of a first conductivity type on a substrate where at least a surface portion of the substrate is formed of silicon, and an impurity diffusion region of a second conductivity type provided in the compound semiconductor layer as a light emitting layer, wherein said diffusion region is a solid-phase diffusion layer, wherein said diffusion region is formed from the surface of said compound semiconductor layer to a depth of 20 to 60% of the depth of said compound semiconductor layer.

2. The light-emitting diode according to claim 1, wherein the lower limit of the diffusion impurity concentration in said diffusion region is $5 \times 10^{19}$ atom/cm$^3$.

3. The light-emitting diode according to claim 1, further said substrate is entirely formed of silicon.

4. the light-emitting diode according to claim 1, further comprising a buffer layer interposed between the first compound semiconductor layer and said substrate, said buffer layer is an additional compound semiconductor layer of said first conductivity type.

5. A light-emitting diode having a compound semiconductor layer of a first conductivity type on a substrate where at least a surface portion of the substrate is formed of silicon, and impurity diffusion regions of a second conductivity type provided in the compound semiconductor layer as a light emitting layer, said diffusion regions being aligned to form an array, wherein said diffusion regions are solid-phase diffusion layers and are formed from the surface of said compound semiconductor layer to a depth of 20 to 60% of the depth of said compound semiconductor layer.

6. The light-emitting diode array according to claim 5, wherein the lower limit of the diffusion impurity concentration in said diffusion regions is $5 \times 10^{19}$ atoms/cm$^3$.

7. The light-emitting diode array according to claim 5, wherein said substrate is entirely formed of silicon.

8. The light-emitting diode array according to claim 5, further comprising a buffer layer interposed between the first compound semiconductor layer and said substrate, said buffer layer is an additional compound semiconductor layer of said first conductivity type.

* * * * *